(12) United States Patent
Lee et al.

(10) Patent No.: US 9,456,501 B2
(45) Date of Patent: Sep. 27, 2016

(54) NANOWIRE GRID STRUCTURE HAVING GRID PATTERNS AND A SACRIFICIAL LAYER

(71) Applicant: LG INNOTEK CO., LTD., Seoul (KR)

(72) Inventors: Young Jae Lee, Seoul (KR); Kyoung Jong Yoo, Seoul (KR); Jin Su Kim, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 127 days.

(21) Appl. No.: 14/365,506

(22) PCT Filed: Dec. 6, 2012

(86) PCT No.: PCT/KR2012/010518
§ 371 (c)(1),
(2) Date: Jun. 13, 2014

(87) PCT Pub. No.: WO2013/089388
PCT Pub. Date: Jun. 20, 2013

(65) Prior Publication Data
US 2015/0000963 A1    Jan. 1, 2015

(30) Foreign Application Priority Data
Dec. 13, 2011   (KR) .................. 10-2011-0133325

(51) Int. Cl.
*H05K 1/09* (2006.01)
*H05K 3/46* (2006.01)
*H05K 3/16* (2006.01)
(Continued)

(52) U.S. Cl.
CPC ............. *H05K 3/007* (2013.01); *B81C 99/008* (2013.01); *H01L 29/0669* (2013.01); *H05K 1/0274* (2013.01); *H05K 1/0296* (2013.01); *H05K 1/09* (2013.01); *H05K 3/067* (2013.01); *H05K 3/101* (2013.01); *H05K 3/146* (2013.01); *H05K 3/16* (2013.01); *H05K 3/46* (2013.01); *H05K 3/4685* (2013.01); *H05K 2201/09227* (2013.01)

(58) Field of Classification Search
CPC ............................. A47L 15/42; H01L 21/20
USPC .......................................... 174/253
See application file for complete search history.

(56) References Cited

U.S. PATENT DOCUMENTS

| | | | |
|---|---|---|---|
| 7,112,525 B1 | 9/2006 | Bhansali et al. | |
| 7,158,302 B2* | 1/2007 | Chiu | G02B 5/3058 |
| | | | 359/485.03 |
| 7,888,583 B2* | 2/2011 | Lagally | H01L 29/0665 |
| | | | 136/200 |

(Continued)

FOREIGN PATENT DOCUMENTS

| | | |
|---|---|---|
| KR | 10-2006-0018466 A | 3/2006 |
| KR | 10-0716937 B1 | 5/2007 |
| KR | 10-2009-0093081 A | 9/2009 |

OTHER PUBLICATIONS

International Search Report in International Application No. PCT/KR2012/010518, filed Dec. 6, 2012.

*Primary Examiner* — Michael F McAllister
(74) *Attorney, Agent, or Firm* — Saliwanchik, Lloyd & Eisenschenk

(57) ABSTRACT

Provided is a method of manufacturing a nanowire, including: forming a plurality of grid patterns on a grid base layer; forming a sacrificial layer on the grid base layer on which the grid patterns are formed; producing a nanowire grid structure by forming a nanowire base layer on the sacrificial layer; forming a nanowire by wet etching the nanowire base layer; and separating the grid patterns from the nanowire by etching the sacrificial layer.

16 Claims, 4 Drawing Sheets

(51) Int. Cl.
  *H05K 3/00* (2006.01)
  *B81C 99/00* (2010.01)
  *H01L 29/06* (2006.01)
  *H05K 1/02* (2006.01)
  *H05K 3/06* (2006.01)
  *H05K 3/10* (2006.01)
  *H05K 3/14* (2006.01)

(56) References Cited

U.S. PATENT DOCUMENTS

| | | | | |
|---|---|---|---|---|
| 7,892,440 | B1 * | 2/2011 | Bhansali | B81C 1/005 216/2 |
| 8,709,703 | B2 * | 4/2014 | Deng | G02B 5/1857 216/24 |
| 2004/0028875 | A1 * | 2/2004 | Van Rijn | A61L 27/50 428/98 |
| 2004/0166233 | A1 * | 8/2004 | Hong | B82Y 10/00 427/58 |
| 2005/0128788 | A1 * | 6/2005 | Segal | B82Y 10/00 365/151 |
| 2008/0041814 | A1 | 2/2008 | Romano et al. | |
| 2009/0218310 | A1 * | 9/2009 | Zu | B82Y 10/00 216/11 |
| 2011/0084424 | A1 * | 4/2011 | Kaida | B29C 33/424 264/293 |

* cited by examiner

NANOWIRE GRID STRUCTURE HAVING GRID PATTERNS AND A SACRIFICIAL LAYER

CROSS-REFERENCE TO RELATED APPLICATIONS

This application is the U.S. national stage application of International Patent Application No. PCT/KR2012/010518, filed Dec. 6, 2012, which claims priority to Korean Application No. 10-2011-0133325, filed Dec. 13, 2011, the disclosures of each of which are incorporated herein by reference in their entirety.

TECHNICAL FIELD

This application claims priority to Korean Patent Application No. 10-2011-0133325, filed on Dec. 13, 2011, in the Korean Intellectual Property Office, the entire contents of which are hereby incorporated by reference.

Embodiments of the present invention relate to a technology for manufacturing a nanowire.

BACKGROUND ART

A nanowire is a nanowire structure having a size in a unit of nanometer and has various sizes from less than 10 nm in diameter provided with general nanowire to several hundred nm. The nanowire is advantageous in that an electromigration property according to a specific direction or an optical property showing polarization can be used. Thus, it is a next generation technology which has been widely applied into various fields of an optical device such as a laser, a transistor, a memory device and the like.

However, a research on a method of manufacturing a nanoparticle and a physical property thereof has been considerably revitalized. In comparison, a research on a method of manufacturing a nanowire lacks. A representative conventional method of manufacturing the nanowire is a method of growing a nanowire metal using a catalyst and a method of forming the nanowire using a template. First, as the method of forming the nanowire material using the template, there are a method of producing an alumina membrane composed of holes having, several dozens nm in diameter and several μm in depth through anodizing, and thereafter filling a nanowire material with the holes, and a method of making the nanowire material in a gas state and depositing it in the holes. Specifically, a technology relating to a method of manufacturing a nanowire using a template, U.S. Pat. No. 6,525,461 describes a technology for forming a titanium nanowire in a pore by forming a catalyst film on a substrate, and forming a porous layer at an upper part to conduct heat treatment. Also, as a technology relating to a method of manufacturing a quantum dot solid using a template, U.S. Pat. No. 6,139,626 describes a technology of forming a quantum dot solid by injecting the colloidal nanocrystals into pores formed in a template and conducting heat treatment. However, the method of manufacturing the nanowire based on the above technology is problematic because the process is very complex and slow, it is not suitable for mass production. Furthermore, it is problematic because it is difficult to control uniformity, the nanowire having excellent straightness and arrangement can be formed.

As the method of growing the nanowire metal using a catalyst, there is a laser assisted catalytic growth (LCG) method or a vapor liquid solid (VLS) growth method described in Korean Laid-Open Patent Publication No. 10-2006-0098959. That is, there a method of growing the nanowire using a nanowire material and a mixture of metals as a raw material, and a metal catalyst as a core. However, the aforesaid method is problematic in that the nanowire has a limit to the formation of the largest length, and high temperature heat treatment process is necessarily required, so it is not suitable for the mass production. Also, in the case of the vapor liquid solid (VLS) growth method, the growth of the nanowire is limited by a diameter of the metal catalyst and a distribution thereof. The method also is problematic in that it is difficult to accurately adjust the width (thickness) and the distribution and contamination is generated due to the metal catalyst in the nanowire. In addition to this, the vapor liquid solid (VLS) growth method has a limit to produce the nanowire in large quantities because equipment used for the method has a high price, a process cost is also high, and because a growing time is slow, a mass production ability is low.

That is, the most methods of manufacturing the nanowire which were already known are not suitable for manufacturing the nanowire having an excellent physical property. in large quantities with a low expense. Thus, the development of a new method of manufacturing the nanowire has been required.

PRIOR ART DOCUMENT (Patent Document 1) U.S Pat. No. 6,525,461 (Feb. 25, 2003)

(Patent Document 2) U.S Pat. No. 6,139,626 (Oct. 31, 2000)

(Patent Document 3) Korean Laid-Open Patent Publication No. 10-2006-0098959 (Sep. 19, 2006)

DISCLOSURE OF INVENTION

Technical Problem

Accordingly, the present invention has been made keeping in mind the above problems occurring in the related art. An aspect of the present invention provides a method of manufacturing a nanowire, including: forming a plurality of grid patterns on a grid base layer; forming a sacrificial layer on the grid base layer on which the grid patterns are formed; producing a nanowire grid structure by forming a nanowire base layer on the sacrificial layer; forming a nanowire by wet etching the nanowire base layer; and separating the grid patterns from the nanowire by etching the sacrificial layer, whereby the nanowire having high uniformity can be manufacture in large quantities at room temperature and with a low production cost.

Solution to Problem

According to an aspect of the present invention, there is provided a nanowire grid structure, including: a grid base layer on which a plurality of grid patterns are formed; a sacrificial layer formed on the grid base layer on which the grid patterns are formed; and a nanowire base layer formed on the sacrificial layer so that a void is formed between the respective grid patterns.

According to another aspect of the present invention, there is provided a method of manufacturing a nanowire, including: forming a plurality of grid patterns on a grid base layer; forming a sacrificial layer on the grid base layer on which the grid patterns are formed; producing a nanowire grid structure by forming a nanowire base layer on the sacrificial layer so that a void is formed between the grid patterns; forming a nanowire by wet etching the nanowire base layer; separating the grid patterns from the nanowire by etching the sacrificial layer.

Advantageous Effects of Invention

According to some embodiments of the present invention, the nanowire can be easily manufactured even at room temperature without a high temperature heat treatment process, thereby improving process effectiveness.

According to some embodiments of the present invention, a width and a height of the nanowire to be produced can be adjusted by adjusting a wet etching time at the wet etching process.

Furthermore, according to some embodiments of the present invention, as the nanowire is manufactured by the wet etching process, the nanowire can be manufactured at room temperature and with a low manufacturing cost.

Also, according to some embodiments of the present invention, it is advantageous because the grid patterns is separated from the nanowire by the process of etching the sacrificial layer, which is easy to conduct, the nanowire can be prevented from being damaged during the separation and improved process effectiveness resulting from the simplification of the process can be realized.

Moreover, according to some embodiments of the present invention it is also advantageous that the nanowire can be manufactured in large quantities and can have high uniformity in spite of the mass production.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Exemplary embodiments according to the present invention will now be described more fully hereinafter with reference to the accompanying drawings. The exemplary embodiments of the present invention may, however, be embodied in many different forms and should not be construed as limited to the embodiments set forth herein. Rather these example embodiments are provided so that this disclosure will be thorough and complete, and will fully convey the scope of the invention to those skilled in-the art. Furthermore, when it is determined that specific descriptions regarding publicly known relevant functions or configurations may unnecessarily be beside main points of the present invention, corresponding descriptions are omitted. It will be further understood that terms used herein should be interpreted as having a meaning that is consistent with their meaning in the context of this specification. With regard to the elements which perform similar functions and operations, like numbers refer to like elements through the specification.

Figure 1:
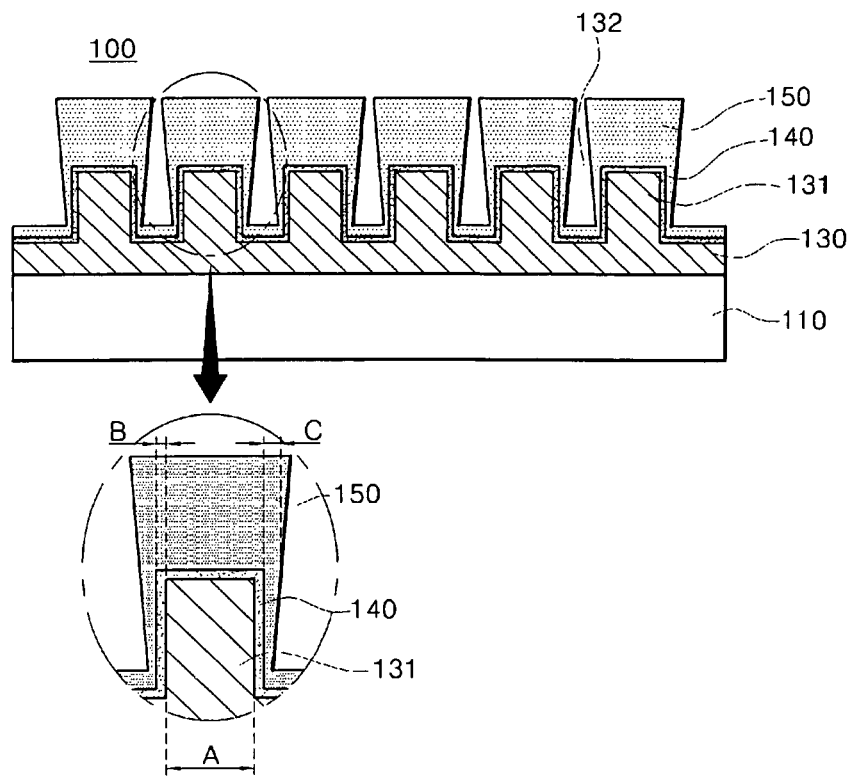
FIG. 1 illustrates roughly the structure of a nanowire grid structure according to the present invention.

FIG. 1 illustrates roughly a structure of a nanowire grid structure according to the present invention. In the present invention, a nanowire grid structure means a structure which is formed before an etching process in manufacturing processes of a nanowire is performed Referring to FIG. 1, a nanowire grid structure 100 according to the present invention may include: a plurality of grid patterns 131 formed on a grid base layer 130; a sacrificial layer 140 formed on the grid base layer 130 on which the grid patterns 131 are formed; and a nanowire base layer 150 formed on the sacrificial layer 140, wherein a substrate 110 for supporting the grid base layer 130 may be further formed at a lower part of the grid base layer 130.

The substrate 110 is a part which supports the grid base layer 130, the grid patterns 131 formed at an upper part of the grid base layer 130, the sacrificial layer 140, and the nanowire base layer 150. A material of the substrate 110 may use plastic, sapphire and the like composed of various polymers such as glass, quartz, acryl, polycarbonate (PC) and polyethylene terephthalate (PET). In addition to this, various materials may be also used. Moreover, in a case where the grid patterns 131 are formed of a photo curable polymer, the substrate 110 of the present invention may be formed of a transparent material through which light can pass. However, the present invention is not limited to this.

The grid base layer 130 and the plurality of grid patterns 131 are formed on the substrate 110. The grid base layer 130 may be formed of a photo curable polymer or a thermosetting polymer. The grid patterns 131 may be formed by a nano imprinting process in which a pattern is transferred by pressurizing the grid base layer 130 with an imprint mold. At this time, a width (A) of the grid patterns 131 may be appropriately adjusted in consideration of a manufacturing process and a width of the nanowire to be produced. More specifically, the width may be formed in a range of 20 to 200 nm. However, the present invention is not limited to this.

As illustrated in the drawing, the sacrificial layer 140 is formed on the grid base layer 130 on which the grid patterns 131 are formed. The sacrificial layer 140 of the present invention is a constituent element which enables the grid patterns to be easily separated from the nanowire to be produced later. According to the present invention, it is advantageous in that the nanowire can be prevented from be damaged during the separation and improved process effectiveness resulting from the simplification of processes can be realized. The sacrificial layer 140 may be formed by depositing a sacrificial layer material on the grid patterns 131 using all deposition methods such as a sputtering method, a chemical vapor deposition method, an evaporation method and the like which can be embodied according to future technical development or have been developed and commercialized. At this time, the sacrificial layer material which forms the sacrificial layer 140 may be variously selected depending on a nanowire material which will be deposited for forming the nanowire later. That is, materials having a different etchant from the nanowire material may be used as the sacrificial layer material of the present invention. More specifically, a nanowire material and a material having large wet etching selectivity may be used as the sacrificial layer material. In a case where the nanowire is formed by etching the nanowire base layer 150 later, if the sacrificial layer 140 is first etched, the desired nanowire may be obtained. For example, when the nanowire material is any one of poly-Si, SiC, SiN, TiN, Ti, and Al, oxide may be used as the sacrificial layer material. Also, when the nanowire material is any one of oxide, SiC and SiN, poly-Si may be used as the sacrificial layer material. Furthermore, the nanowire material is Ni, Cu or Al may be used as the sacrificial layer material, and when the nanowire material is Ag, Al may be used as the sacrificial layer material. Moreover, when the nanowire material is Au, any one of Cu, Ni, and Al may be used as the sacrificial layer material. When the nanowire material is Cu, Al or Ti may be used as the sacrificial layer material. Of course, in the case of the opposite, for example, when the nanowire material is Al or Ti, Cu may be used as the sacrificial layer material.

However, the aforesaid contents are only one example. In addition to this, the sacrificial layer may be variously selected and used according to the kind of the nanowire material. That is, the sacrificial layer of the present invention may be formed using all materials having a different etchant from the nanowire material Meanwhile, a ratio between a width (A) of the grid patterns 131 and a thickness (B) of the sacrificial layer 140 formed on a side of the grid patterns 131 may be appropriately adjusted depending on the convenience of processes, and specs of the nanowire which will be produced later. More specifically, the width and the thickness may be formed so the ratio (A:B) becomes 1:0.1 to 1:0.5. For example, when the width (A) of the grid patterns 131 is formed in 50 nm, the thickness (B) of the sacrificial layer 140 formed on the side of the grid patterns may be formed in a range of 5 to 25 nm.

The nanowire base layer 150, which is a part which will be the nanowire by being etched later, is formed on the sacrificial layer 140. The nanowire base layer 150 of the present invention may be formed by depositing the nanowire material on the sacrificial layer 140 using all deposition methods such as a sputtering method, a chemical vapor deposition method which can be embodied according to future technical development or have been developed and commercialized, an evaporation method and the like. At this time, the nanowire base layer 150 may be formed in a structure in which a void 132 is formed between the respective grid patterns. However, the present invention is not limited to this. The void 132 is formed between the respective grid patterns 131 to be spaced apart from the respective grid patterns 131 so that the etching of the nanowire base layer 150 at a wet etching process which will be carried out later may be smoothly performed.

Meanwhile, a ratio between the width (A) of the grid patterns 131 and a thickness (C) of the nanowire base layer 150 formed on the side of the grid patterns 131 may be appropriately adjusted depending on the convenience of processes, and specs of the nanowire which will be produced later. More specifically, the width and the thickness are formed so that the ratio (A:C) becomes 1:0.1 to 1:0.5. For example, when the width (A) of the grid patterns 131 is formed in 50 nm, the thickness (C) of the nanowire base layer 150 formed on the side of the grid patterns may be formed in a range of 5 to 25 nm.

Also, a ratio between thicknesses (B, C) of the sacrificial layer 140 and the nanowire base layer 150 which are sequentially formed on the side of the grid patterns 131 may be also appropriately adjusted depending on the convenience of processes and the specs of the nanowire which will be produced later. More specifically, the thicknesses are formed so that the ratio (B:C) becomes 1:0.1 to 1:1.5. For example, when the thickness (B) of the side of the sacrificial layer 140 is formed in 20 nm, the thickness (C) of the nanowire base layer 150 formed on the side of the sacrificial layer 140 may be formed in a range of 2 to 30 nm. As the ratio of the thicknesses of the side per each layer is maintained, a desired thickness (or diameter) of the nanowire may be adjusted depending on the control of an etching time at an wet etching process later. For example, when the thickness (B) of the side of the sacrificial layer 140 is formed to be thick or thin in the thickness (C), the nanowire base layer 150 formed on the side of the sacrificial layer 140 through the deposition of the nanowire material may be deposited to be thin or thick. Thus, the thickness (or diameter) of the nanowire may be easily adjusted depending on the adjustment of an etching time at a wet etching process. As a result, the freedom of a process can be improved.

When the nanowire grid structure 100 of the present invention having the aforesaid structure is used, the nanowire can be manufactured by the further simple wet etching process and the sacrificial layer etching process. Thus, it is advantageous in that the nanowire can be easily manufactured even at room temperature without a heat treatment process at high temperature, and can be also formed with a low manufacturing cost. Furthermore, it is advantageous in that damage of the nanowire which may be generated at a separation process can be prevented, and improved process effectiveness resulting from the simplification of processes can be realized. Moreover, the nanowire can be manufactured in large quantities, and in spite of the mass production, the nanowire having high uniformity can be manufactured.

Figure 2:
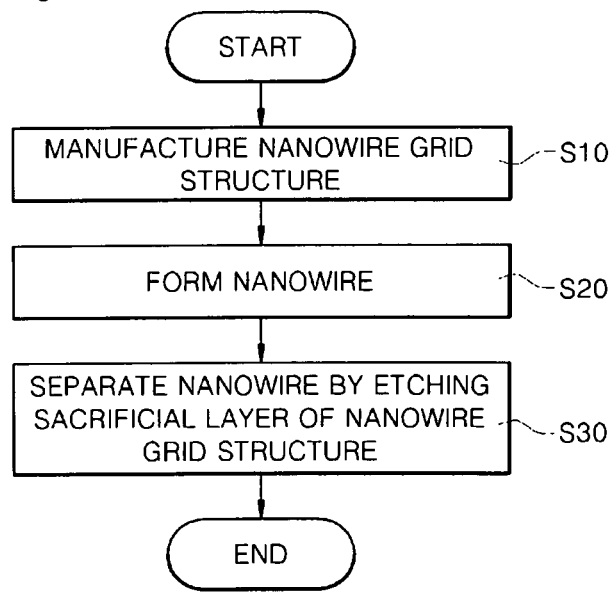
FIG. 2 is a flow chart showing a method of manufacturing a nanowire according to the present invention.
Figure 3:
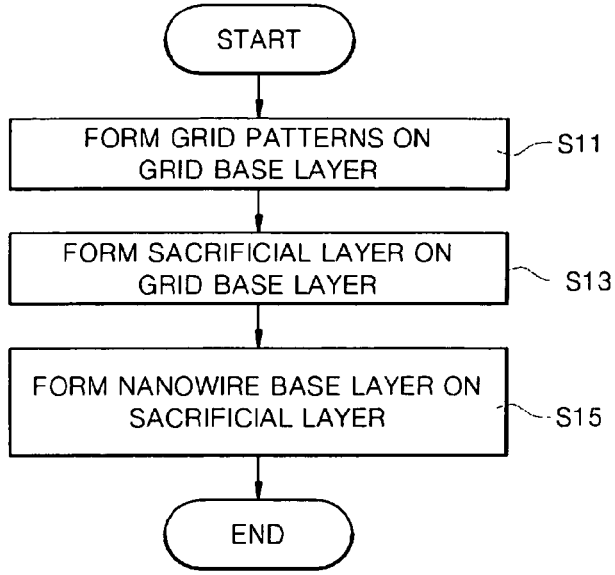
FIG. 3 is a flow chart showing a method of manufacturing a nanowire according to the present invention.

FIG. 2 and FIG. 3 are flow charts illustrating a method of manufacturing the nanowire according to the present invention.

Referring to FIG. 1 to FIG. 3, the method of manufacturing the nanowire according to the present invention comprises: producing the nanowire grid structure having the grid patterns, the sacrificial layer, and the nanowire base layer as illustrated in FIG. 1 (S10); forming the nanowire by wet etching the nanowire bases layer (S20); and separating the grind patterns from the nanowire by etching the sacrificial layer (S30).

Here, a process (S10) of manufacturing a nanowire grid structure may be performed by first forming the grid patterns on the grid base layer (S11), forming the sacrificial layer on the grid base layer on which the grid patterns are formed (S13), and forming the nanowire base layer on the sacrificial layer (S15).

The process (S11) for forming the grid patterns on the grid base layer may be performed by a nano imprinting process. More specifically, it may be by the following steps. A polymer material, for example, an UV resin which is a photo curable polymer, is first applied to the substrate to form the grid base layer. An explanation on the material of the substrate is omitted because it is the same as that described above in FIG. 1. Next, an imprint mold having grooves and protrusion parts are arranged at an upper part of the grid base layer. Here, the plurality of grooves and protrusion parts of the imprint mold have a shape in which they are repeatedly formed to be spaced apart from each other at regular intervals. Also, the grooves of the imprint mold correspond to a position where the grid patterns will be formed.

Then, the part of the groove of the imprint mold and the grid base layer are pressurized so as to come into contact with each other, and thereafter ultraviolet rays are irradiated thereto, thereby enabling them to be photo curable. Thus, in the upper part of the grid base layer, the plurality grid patterns are formed at a part corresponding to a groove of the imprint mold. At this time, the imprint mold may be formed of a transparent material such as quartz and the like so that light (e.g. ultraviolet rays) can pass through, or may be also formed of a soft material to enable a roll-to-roll process to be performed. Meanwhile, the width W of the groove may be formed in a range of, specifically, 20 nm to 200 nm. However, the present invention is not limited to this. This is intended to enable the width of the grid patterns formed at the part corresponding to the groove to have a range of 20 nm to 200 nm. However, this is only one example. The width of the groove of the imprint mold and the width of the grid patterns may be appropriately modified in consideration of the width of the nanowire to be produced later.

Meanwhile, in the aforesaid exemplary embodiment, it is explained that a photo curable polymer is used as the material for forming the grid base layer. However, a thermosetting polymer may be also used, and thus the grid patterns of the present invention may be formed by pressuring the grid base layer with the imprint mold, and thereafter conducting a heat curing process. For example, the grid patterns of the present invention may be formed in such a manner that after the grid base layer is formed of a thermosetting polymer, the grid base layer is hardened by pressurizing it with the heated imprint mold. Meanwhile, in a case where the material which forms the grid base layer is a thermosetting polymer, the imprint mold may be formed of a material which is able to bear a heating and high pressure process.

Then, the sacrificial layer is formed on the grid base layer on which the grid patterns are formed (S13). The formation of the sacrificial layer may be performed as described below.

The sacrificial layer material is deposited on the upper surface and the side of the grid patterns formed in step S11. At this time, the deposition of the sacrificial material layer may be performed using all deposition methods such as a sputtering method, a chemical vapor deposition method, an evaporation method and the like which can be embodied according to future technical development or have been developed and commercialized. At this time, the sacrificial layer material which forms the sacrificial layer 140 may be variously selected depending on a nanowire material which will be deposited for forming the nanowire later. That is, materials having a different etchant from the nanowire material may be used as the sacrificial layer material of the present invention. More specifically, a nanowire material and a material having large wet etching selectivity may be used as the sacrificial layer material. In a case where the nanowire is formed by etching the nanowire base layer 150 later, if the sacrificial layer 140 is first etched, the desired nanowire may be obtained. For example, when the nanowire material is any one of poly-Si, SiC, SiN, TiN, Ti, and Al, oxide may be used as the sacrificial layer material. Also, when the nanowire material is any one of oxide, SiC and SiN, poly-Si may be used as the sacrificial layer material. Furthermore, the nanowire material is Ni, Cu or Al may be used as the sacrificial layer material, and when the nanowire material is Ag, Al may be used as the sacrificial layer material. Moreover, when the nanowire material is Au, any one of Cu, Ni, and Al may be used as the sacrificial layer material. When the nanowire material is Cu, Al or Ti may be used as the sacrificial layer material. Of course, in the case of the opposite, for example, when the nanowire material is Al or Ti, Cu may be used as the sacrificial layer material. Meanwhile, the sacrificial material may be deposited so that the the ratio between width of the grid patterns and the thickness of the sacrificial layer formed on the side of the grid patterns is in a range of 1:0.1 to 1:0.5. The detailed contents are the same as described in the explanation of FIG. 1, and thus are omitted.

Then, the nanowire base layer is formed on the sacrificial layer (S15) and the formation of the nanowire base layer is performed as described below. The nanowire base layer is formed by depositing a nanowire material on the sacrificial layer using all deposition methods such as a sputtering method, a chemical vapor deposition method, an evaporation method and the like which can be embodied according to future technical development or have been developed and commercialized. Here, the nanowire material may be materials having a different etchant from the sacrificial layer material. The material may be composed of at least any one of a metal, metallic oxide, a nitride, a ceramic material. For example, the metal such as Ag, Cu, Al, Cr, Ni, Au and the like, the metallic oxide such as AgO, Al2O3, ZnO, ITO, and the like, and the ceramic material such as Si or SiO2, SiN, SiC and the like may be used as the nanowire material. However, this is only one example, but the scope of rights of the present invention should not be limited to this. In addition to these materials, various materials may be deposited on the grid patterns as the nanowire material depending on the purpose of use. At this time, the nanowire material may be deposited to have a vacant void between each grid patterns rather than being filled with each grid patterns. This is the same as described in the above explanation of FIG. 1.

Meanwhile, a ratio between the width of the grid patterns and a thickness of the side of the nanowire base layer formed on a side of the grid patterns (or a thickness of the nanowire base layer formed on the side surface of the grid patterns) may be appropriately adjusted depending on the convenience of processes, and specs of the nanowire to be produced later. More specifically, the width and the thickness may be so that the ratio is in the range of 1:0.1 to 1:0.5. Also, the ratio between the thickness of the side of the sacrificial layer (or a thickness of the sacrificial layer formed on the side surface of the grid patterns) and a thickness of the side of the nanowire base layer may be also appropriately adjusted depending on the convenience of processes, and specs of the nanowire to be produced later. More specifically, the thicknesses may be formed so that the ratio is in the range of 1:0.1 to 1:1.5. The detailed contents are the same as those as described in the explanation of FIG. 1 and thus are omitted.

After the nanowire grid structure is produced through aforesaid step S11 to step S13, the nanowire is formed by wet etching the nanowire base layer (S20). At this time, the width and the thickness of the nanowire are adjusted by adjusting a wet etching time, thereby enabling the nanowire having desired specs to be formed.

In step S30, the nanowire formed in step S20 is separated from the grid patterns. At this time, the separation of the nanowire and the grid patterns may be realized by etching the sacrificial layer formed on the grid patterns in step S13. An etching solution used at this time may be variously selected and combined according to the kind of sacrificial layer materials.

The method of manufacturing the nanowire according to the present invention including aforesaid processes is provided with the following advantages: Unlike the conventional method, as the wet etching time is adjusted, the width and the height of the nanowire to be produced can be adjusted; the nanowire can be easily manufactured even at room temperature with a low production cost; the nanowire can be produced in large quantities; and in spite of the mass production, the nanowire having high uniformity can be produced. Moreover, in addition to this, it is advantageous because the grid patterns formed on the substrate and formed during the manufacturing process can be again utilized at the manufacturing process of the nanowire, the more production cost can be reduced, so the method is economical.

FIG. 4 through FIG. 11 are views showing manufacturing processes for a method of manufacturing a nanowire according an exemplary embodiment of the present invention.

Figure 4:
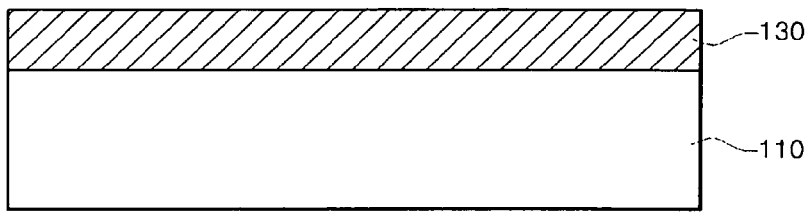
FIG. 4 is a view showing a manufacturing stage for a method of manufacturing a nanowire according an exemplary embodiment of the present invention.

Referring to FIG. 1 through FIG. 11, as illustrated in FIG. 4, the grid base layer 130 is formed by applying a material composed of a polymer material to the substrate 110.

Figure 5:
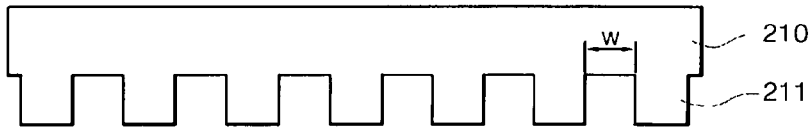
FIG. 5 is a view showing a manufacturing stage for a method of manufacturing a nanowire according to an exemplary embodiment of the present invention.

Then, as illustrated in FIG. 5, an imprint mold 210 is arranged in the upper part of the grid base layer 130. Here, as described in the explanation of FIG. 1, the imprint mold 210 has a plurality of protrusion parts 211 arranged at regular intervals and a plurality of grooves formed between the protrusion parts. Here, more specifically, the width W of the grooves may be formed in a range of 20 nm to 200 nm. As described in the explanation of FIG. 1, the present invention is not limited to this.

Figure 6:
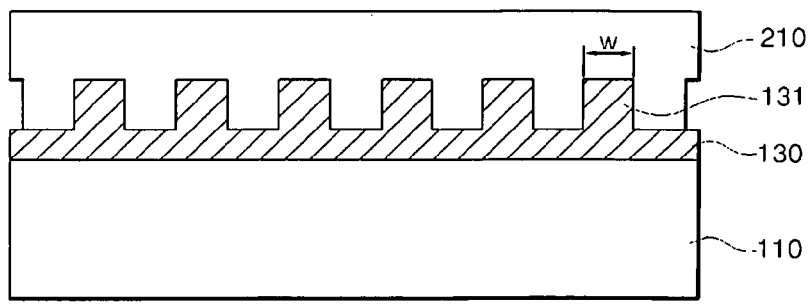
FIG. 6 is a view showing a manufacturing stage for a method of manufacturing a nanowire according to an exemplary embodiment of the present invention.
Figure 7:
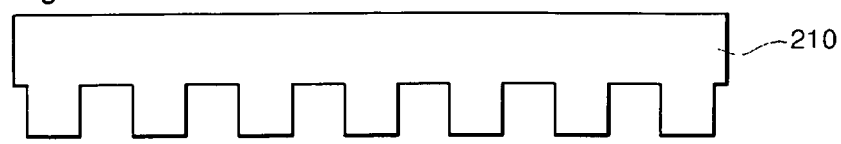
FIG. 7 is a view showing a manufacturing stage for a method of manufacturing a nanowire according to an exemplary embodiment of the present invention.
Figure 7:
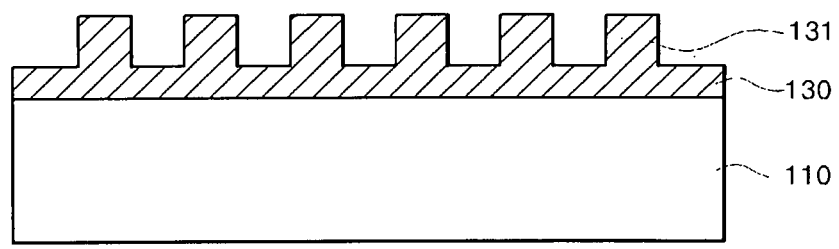

As illustrated in FIG. 6, after the upper part of the grid base layer 130 is pressurized using the imprint mold 210, as illustrated in FIG. 7, the grid patterns 131 is formed by separating the imprint mold 210 therefrom. At this time, before the separating of the imprint mold 210 after the pressurizing of the grid base layer 130 using the imprint mold 210, a heat curing process or a photo curing process by the irradiation of light (e.g. ultraviolet rays) may be conducted according to the kind of materials which form the grid base layer 130.

Figure 8:
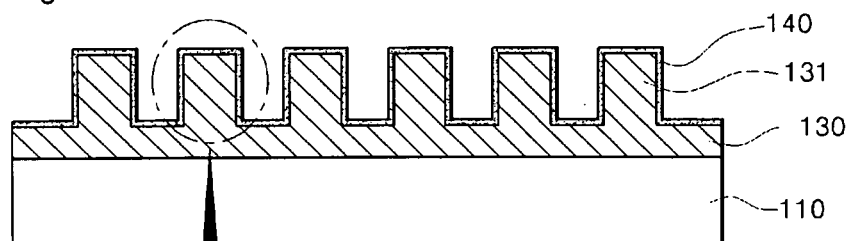
FIG. 8 is a view showing a manufacturing stage for a method of manufacturing a nanowire according to an exemplary embodiment of the present invention.
Figure 8:
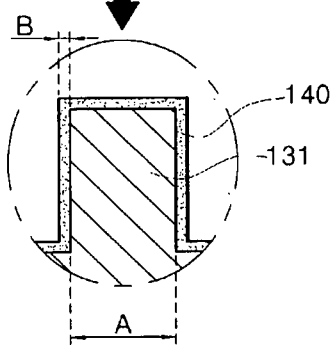

After the forming of the grid patterns, as illustrated in FIG. 8, the sacrificial layer 140 is formed by depositing the sacrificial layer material on the grid patterns 131. The deposition of the sacrificial layer material may be realized by a sputtering method, a chemical vapor deposition method, an evaporation method and the like. Here, the sacrificial layer material may use a material having a different etchant from the nanowire material. More specifically, a nanowire material and a material having a high wet etching selection ratio may be used as the sacrificial layer material. At this time, a ratio between the width (A) of the grid patterns 131 and the thickness (B) of the sacrificial layer 140 formed on the side of the grid patterns 131 may be appropriately adjusted depending on the convenience of processes, and specs of the nanowire to be produced later. More specifically, the width and the diameter may be formed so the ratio (A:B) becomes 1:0.1~0.5. The further detailed contents are the same as those as described in the explanation of FIG. 1 and thus are omitted.

Figure 9:
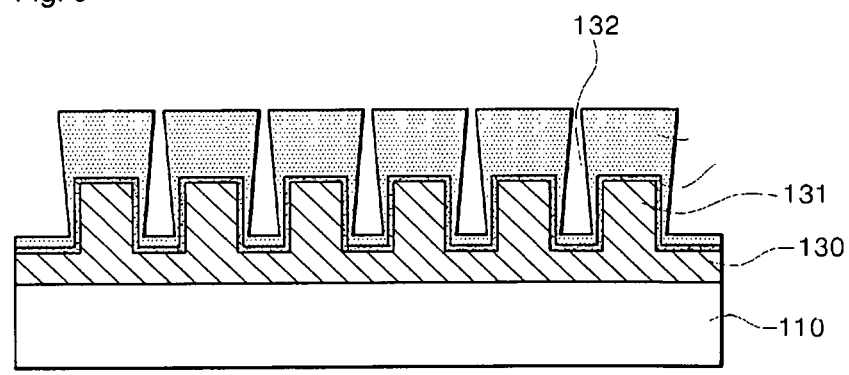
FIG. 9 is a view showing a manufacturing stage for a method of manufacturing a nanowire according to an exemplary embodiment of the present invention.

After the sacrificial layer 140 is formed, as illustrated in FIG. 9, the nanowire base layer 150 is formed by depositing the nanowire material on the grid patterns 131 on which the sacrificial layer 140 is formed. At this time, as described in the explanation of FIG. 1, the nanowire base layer 150 may be formed to have the void 132 between the respective grid patterns 131 as illustrated in FIG. 9, so that etching of the nanowire base layer 150 to be conducted later may be smoothly performed.

Here, the nanowire material deposited on the grid patterns 131 may use a material having a different etchant from the sacrificial material, and may be at least any one of a metal, a metallic oxide material, a nitride, and a ceramic material. As described in the explanation of FIG. 1, the deposition method may use all deposition methods such as a sputtering method or a chemical vapor deposition method and an evaporation method and the like which have been developed and commercialized or can be embodied depending on future technical development.

Meanwhile, the ratio between the width (A) of the grid patterns 131 and a thickness (C) of the nanowire base layer 150 formed on a side of the grid patterns 131 may be appropriately adjusted depending on the convenience of processes, and specs of the nanowire to be produced later. More specifically, the width and the thickness may be formed so that the ratio (A:C) becomes 1:0.1 to 1:1.5. Also, the ratio between the thicknesses (B, C) of the sacrificial layer 140 and the nanowire base layer 150 formed on the side of the grid patterns 131 may be also appropriately adjusted depending on the convenience of processes, and specs of the nanowire to be produced later. More specifically, the thicknesses may be formed so that the ratio (B:C) becomes 1:0.1 to 1:1.5. The further detailed contents are the same as those as described in the explanation of FIG. 1 and thus are omitted.

Figure 10:
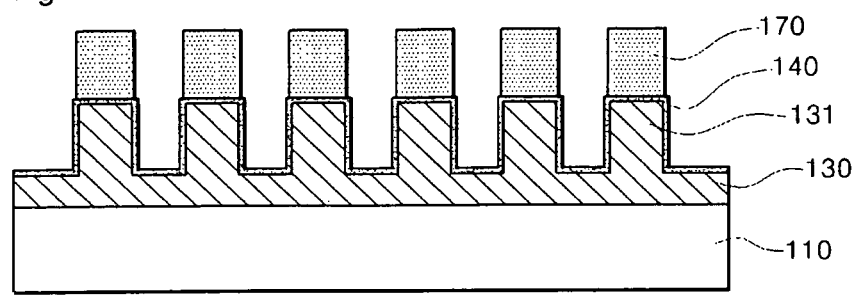
FIG. 10 is a view showing a manufacturing stage for a method of manufacturing a nanowire according to an exemplary embodiment of the present invention.

After the nanowire base layer 150 is formed, as illustrated in FIG. 10, the nanowire 170 is formed by wet etching the void between the respective grid patterns 131. At this time, the width and the thickness of the nanowire 170 may be adjusted by adjusting a wet etching time.

Figure 11:
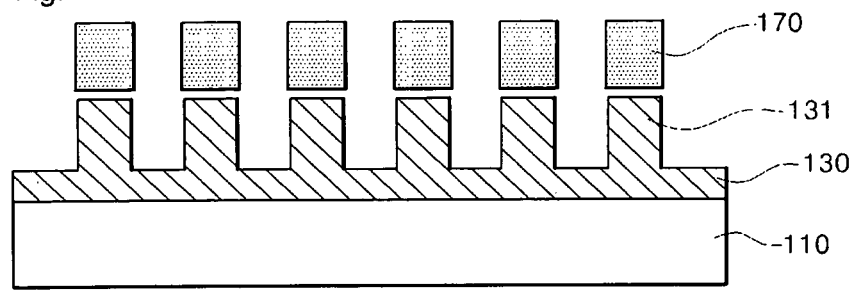
FIG. 11 is a view showing a manufacturing stage for a method of manufacturing a nanowire according to an exemplary embodiment of the present invention.

After the forming of the nanowire 170, the sacrificial layer 140 is etched using an etching solution, thereby enabling the nanowire to be separated from the grid patterns, as illustrated in FIG. 11. The etching solution used at this time may be variously selected and combined according to the kind of sacrificial layer materials. Accordingly, it is advantageous because the nanowire is separated from the grid patterns through the process of etching the sacrificial layer which is easy to conduct, the nanowire can be prevented from being damaged during the separation, and process effectiveness can be improved due to the simplification of the process.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A nanowire grid structure, comprising:
   a grid base layer on which a plurality of grid patterns is formed;
   a sacrificial layer formed on the grid base layer on which the grid patterns are formed; and
   a nanowire base layer formed on the sacrificial layer so that a void is formed between the respective grid patterns;
   wherein a ratio between a width of the grid patterns and a thickness of the sacrificial layer formed on a side of the grid patterns is 1:0.1 to 1:0.5.

2. The structure of claim 1, wherein a ratio between the width of the grid patterns and a thickness of the nanowire base layer formed on the side of the grid patterns is 1:0.1 to 1:0.5.

3. The structure of claim 1, wherein a ratio between the thickness of the sacrificial layer formed on the side of the grid patterns and the thickness of the nanowire base layer is 1:0.1 to 1.0.5.

4. The structure of claim 1, wherein the width of the grid patterns is formed in a range of 20 nm to 200 nm.

5. The structure of claim 4, wherein an etchant of the sacrificial layer and an etchant of the nanowire base layer are formed of different materials from each other.

6. The structure of claim 5, wherein the nanowire base layer comprises at least one material of a metal, a metallic oxide material, a nitride, and a ceramic material.

7. The structure of claim 5, wherein the sacrificial layer comprises at least any one of oxide, poly-Si, Cu, Al, Ni, Ti and Cr.

8. The structure of claim 4, wherein the grid patterns are formed of a photo curable polymer or a thermosetting polymer.

9. A nanowire grid structure, comprising:
   a substrate;
   a grid base layer disposed on the substrate and having a plurality of grid patterns;
   a sacrificial layer disposed on the grid base layer; and
   a nanowire base layer disposed on the sacrificial layer,
   wherein the sacrificial layer and the nanowire base layer contain materials having different etchants; and
   wherein the nanowire base layer has a void, and a nanowire is formed by wet etching through the void.

10. The nanowire grid structure of claim 9, wherein the nanowire is separated from the grid base layer by etching of the sacrificial layer.

11. The nanowire grid structure of claim 9, wherein grid patterns are formed by pressurizing the grid base layer disposed on the substrate using an imprint mold and hardening the grid base layer.

12. The nanowire grid structure of claim 11, wherein the imprint mold contains a soft material to enable a roll-to-roll process to be performed.

13. The nanowire grid structure of claim 11, wherein the grid base layer contains a photo curable polymer, and the imprint mold contains a material which light is able to pass through.

14. The nanowire grid structure of claim 9, wherein the sacrificial layer is provided by depositing a sacrificial layer material on the grid pattern layer using at least one method of a sputtering method, a chemical vapor deposition method, and an evaporation method.

15. The nanowire grid structure of claim 9, wherein the nanowire base layer is provided by depositing a nanowire material on the sacrificial layer using at least one method of a sputtering method, a chemical vapor deposition method, and an evaporation method.

16. The nanowire grid structure of claim 9, wherein the grid base layer contains a photo curable polymer, and the substrate contains a material which light is able to pass through.

* * * * *